Figure 1:
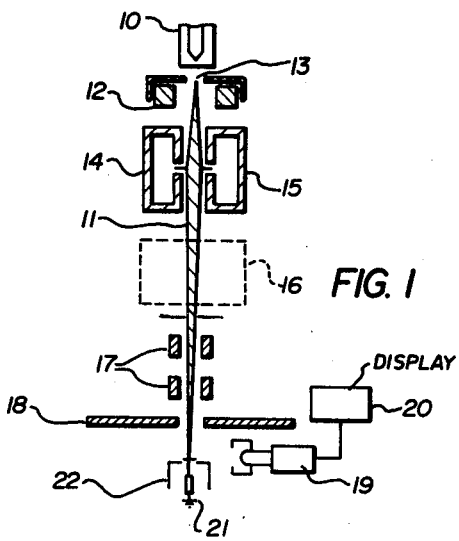

United States Patent [19]

Sewell et al.

[11] 4,179,609

[45] Dec. 18, 1979

[54] POINT SCATTERING DETECTOR

[76] Inventors: Peter B. Sewell, 68 Cleadon; Kovilvila N. Ramachandran, 40 Columbus Ave., both of Ottawa, Ontario, Canada

[21] Appl. No.: 885,295

[22] Filed: Mar. 10, 1978

[51] Int. Cl.² ............................................. G01N 27/00
[52] U.S. Cl. ..................................... 250/397; 250/311; 250/396 R
[58] Field of Search ............ 250/311, 310, 309, 396 R, 250/306, 397, 398; 324/71 EB

[56] References Cited

U.S. PATENT DOCUMENTS 2,548,870  4/1951  Colterjohn ........................... 250/309
4,086,491  4/1978  Vaughan ............................. 250/397

Primary Examiner—Bruce C. Anderson
Attorney, Agent, or Firm—J. R. Hughes

[57] ABSTRACT

A beam analyzing system using a point scattering detector in conjunction with the standard secondary electron collector and imaging system of a scanning electron microscope. The detector consists of a sharp metal (preferably tungsten) tip located centrally in a biased aperture assembly mounted in the specimen stage. By scanning the image within the aperture and collecting the secondary electrons scattered from a controlled region of the tip, the electron beam intensity can be obtained and reconstructed on a display screen.

3 Claims, 3 Drawing Figures

POINT SCATTERING DETECTOR

This invention relates to an imaging detector for analyzing electron intensity distributions of electron beams in scanning electron microscopes and similar apparatus.

The electron optical elements of the scanning electron microscope (SEM) produce a demagnified image of the effective electron source at the specimen level. Electron guns using thermionic emitters such as tungsten and lanthanum hexaboride (LaB$_6$) have been designed to obtain the maximum theoretical brightness from these materials under certain conditions. However, during operation of an electron gun, its performance can be degraded by poor alignment between the cathode tip, the grid and anode. Gun alignment can be critically evaluated by examining the symmetry of the source image or crossover, as is well known for the case of transmission electron microscopy (TEM). In the TEM, imaging of the crossover is performed routinely, as a demagnified image of the crossover can be produced at the specimen level using the condenser lenses. This image is magnified by the objective and projector lenses and examined on the viewing screen. Gun alignment is carried out by examining 'unsaturated' images of the crossover and adjusting these so called Wehnelt images for maximum symmetry, using the controls provided. However, in the SEM there is no routine method of producing magnified images of the crossover and thus, optimum gun alignment is rarely achieved.

It is an object of the invention to provide a means of analyzing the electron intensity distributions of electron beams in electron microscopes.

It is an other object of the present invention to provide a means of optimizing the performance of the electron gun in a scanning electron microscope.

This and other objects of the invention are achieved by a beam analyzing system using a point scattering detector in conjunction with the standard secondary electron collector and imaging system of a scanning electron microscope. The detector consists of a sharp metal (preferably tungsten) tip located centrally in a biased aperture assembly mounted in the specimen stage. By scanning the image within the aperture and collecting the secondary electrons scattered from a controlled region of the tip, the electron beam intensity can be obtained and reconstructed on a display screen.

Figure 2:
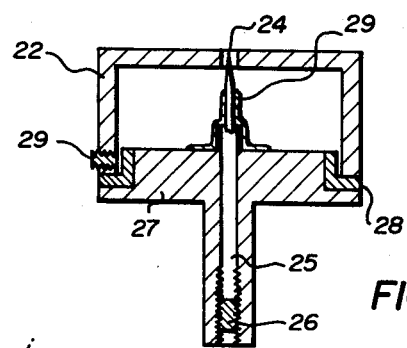
Figure 3:
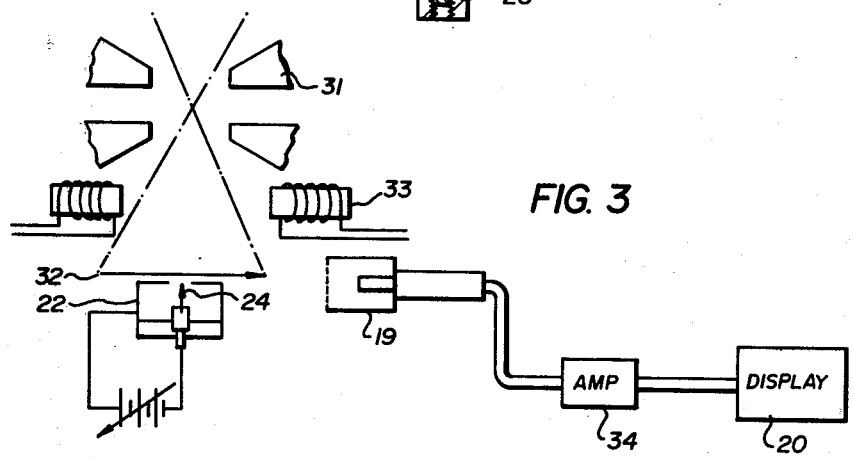

In drawings which illustrate an embodiment of the invention,

FIG. 1 is a schematic view of the main elements of a SEM used for producing source images, FIG. 2 is a cross-section of a point scattering detector, and FIG. 3 is a schematic view of the point scattering detector applied to a transmission electron microscope.

Referring to FIG. 1, the elements of a standard SEM used for producing source images are shown. The source i.e. an electron beam gun 10 with gun alignment means initiates beam 11 that passes through beam alignment coils 12. Beam crossover point 13 appears at the position shown. The beam passes through condenser coils 14 including fixed aperture 15 but it should be noted that the second set of condenser coils (shown with dotted lines) normally used on a SEM is not required although standard aperture 16 is used. Scan coils 17, objective plane 18, the secondary electron collector 19, and display 20 complete the main parts of the SEM. The point scattering detector 21 connected to ground is located as shown and includes an aperture plate 22 connected to a voltage supply e.g. +(50–150) volts.

It is clear from FIG. 1 that a source could be constructed by scanning the focused image at the specimen level across a Faraday cup having a small defining aperture, and producing an image from the collected currents. Since the magnified image of a typical crossover of some 25 $\mu$m diameter is only about 90 $\mu$m diameter, a small defining aperture of about 1 $\mu$m diameter would be needed for reasonable image resolution. For the electron optical configuration shown in FIG. 1, when using a 50 $\mu$m aperture in condenser lens 15, the beam current in the image is about $1 \times 10^{-7}$ A for a total emission current of 100 $\mu$A. It can be shown that a 1 $\mu$m aperture would transmit only $1 \times 10^{-11}$ A, even for intense images of the crossover at 'saturation'. An electrometer of high band-width would be needed to image the source with reasonable sweep rates if the above technique was used. Since the secondary electron collector is already available in the SEM and has the specific advantages of high band-width at low current levels, it has been feasible to use a detector system using the standard secondary electron image display.

FIG. 2 shows the detector 21 in more detail and includes sharp tip 24 on mounting tube 25 with suitable height adjustment 26 in base 27. Aperture plate 22 is mounted on base 27 but insulated (insulator 28) therefrom and includes alignment screws 29 for adjustment purposes. The detector tip is prepared from 125 $\mu$m diameter tungsten wire mounted axially in a 1 mm diameter metal tube. The end section of the tungsten wire is thinned electrolytically to about 25 $\mu$m and the tip finally sharpened to less than 0.2 $\mu$m radius by conventional methods of electrolytic sharpening used for field emitter sources. The detector aperture diameter has been determined for a working distance of 1 cm and a scan magnification of 200X. This magnification which results in an overall source magnification of 700X at the screen, was found satisfactory for image display. Under these conditions, each element in the image scans in a rectangular raster having a diagonal of 700 $\mu$m in the plane of the detector aperture. For a large crossover of 100 $\mu$m diameter an image of some 350 $\mu$m diameter is formed at the detector level. This will result in the extremity of the field of scan being increased to about 1050 $\mu$m. A detector aperture of 1.1 mm diameter and 1 mm deep was used in experimental set-ups. As a result, the scanned image always falls within the aperture and unwanted signal from the top of the aperture plate is avoided. Various parts of the detector except the tip, are coated with aquadag 29 in order to reduce the background noise.

In operation the detector is examined initially by conventional SEM techniques with both the aperture and tip at ground potential. At low magnification, the detector wire is aligned parallel to the electron optical axis. An image of the tip is obtained at about 2000X, while the out-of-focus signal from the 25 $\mu$m wire is also clearly visible. The positive potential of the aperture is now increased and the background image of the wire is progressively cut off. At a potential +50 to +150 V the region of the tip being imaged can be reduced to an effective diameter of 1–2 $\mu$m on the side of the tip facing the collector. The application of potential to the aperture appears to enhance the collection efficiency from the extreme end of the tip, which becomes much brighter as the area is reduced. If the magnification is now reduced to 200X, so that the beam raster is within the aperture, a small intense point in a dark background is observed at the center of the screen. The escape of secondary electrons from the base of the cup and the sides of the wire is restricted by the potential on the aperture. In practice, some adjustment of the bias on the secondary electron collector may be required for optimum setting of the detector. With the detector biased, the magnification is reduced to about 50X so that an image of the detector aperture is obtained. The objective lens and the second condenser lens are switched off and the first condenser adjusted for best focus by observing the low resolution image of the aperture plate. The magnification is again increased to 200X and if the tip is within the field of view, an image of the crossover will be visible. This is adjusted for best appearance using the contrast and brightness controls. If the filament temperature is reduced so that the gun is 'unsaturated' the structure in the source should appear and can be used for final focussing of the image using condenser lens 14. All images can be examined at TV display frequencies. This greatly facilitates the adjustment and alignment of the electron gun while observing source images.

The effective variable aperture properties of the point scattering detector (P.S.D.) can be used to analyse other forms of electron intensity distribution with the object of displaying them in reaste form or for line or point analysis.

For example the P.S.D. could be used to replace the last projector lens of a conventional transmission electron microscope so that the microscope image could be displayed on a display oscilloscope or stored on magnetic tape for further processing.

FIG. 3 shows a P.S.D. operating in a transmission electron microscope to display the final image with an effective magnification of about 50X with no loss of image resolution. The image produced by an intermediate a projector lens 31 would be focussed in the plane 32 of the P.S.D. tip and the image scanned across the tip by coils 33. Scattered electrons from the controlled area of the tip 24 in the S.I.D. 22 would be detected by a conventional secondary electron detector 19 amplified in video amp 34 and the image displayed on a C.R.T. 20 in the manner normally used in SEM technology. The resolution of the tip has been shown by experiment to be at least 1μm. Since a typical high resolution C.R.T. display is some 2000 lines over 10 cm (or 50 μm per line), this P.S.D. system acts as a final lens of magnification equivalent to 50 μm/1μm or 50X. This is typical of the lens magnification used for the final projector lens of conventional transmission electron microscopes.

Clearly this method of image anlaysis and display can be applied to any form of electron intensity distribution in any type of electron optical instrument or electron beam device. It has the following advantages of scanning over a fixed aperture:

(i) Fixed aperture of lens than 10μm diameter are subject to rapid contamination and generally are difficult to handle experimentally, (ii) Fixed apertures of less than 10μm diameter are generally so thin that the material of the aperture disc is partially electron transparent, (iii) The P.S.D. can act as an effective aperture of variable diameter over the range of about 1 μm to 100 μm. There is no physical aperture equivalent of this type of operation.

We claim:

1. An imaging system for analyzing electron intensity distributions of electron beams in scanning electron microscopes and similar apparatus comprising a point scattering detector positioned in the electron beam where the distribution is to be measured and including a base, a metal rod having a sharpened tip adjustably mounted on the base, and an apertured plate mounted on but insulated from said base with its aperture positioned in the beam path and adapted to carry a positive electrical potential in relation to the tip such that the electrons can impinge on the sharpened tip of the detector causing secondary electrons to be emitted, means for collecting secondary electron from said tip, and means for measuring and displaying the secondary electron intensity to provide an image pattern of the electron beam.

2. An imaging system as in claim 1 wherein the sharpened tip portion of the metal rod is of a material providing a high secondary electron yield.

3. An imaging system as in claim 1 wherein the sharpened tip portion of the metal rod is made of tungsten.

* * * * *